United States Patent [19]

Miyatake

[11] Patent Number: 5,026,976
[45] Date of Patent: Jun. 25, 1991

[54] DOUBLE-FOCUS DETECTOR UTILIZING CHROMATIC ABERRATION

[75] Inventor: Tsutomu Miyatake, Nihama, Japan

[73] Assignee: Sumitomo Heavy Industries Co., Ltd., Japan

[21] Appl. No.: 485,240

[22] Filed: Feb. 26, 1990

[30] Foreign Application Priority Data

Feb. 27, 1989 [JP] Japan .................................. 1-43292

[51] Int. Cl.⁵ .............................................. G01J 1/20
[52] U.S. Cl. ................................ 250/201.4; 250/201.7
[58] Field of Search ........................ 250/201.4, 207.7; 354/403; 356/215

[56] References Cited

U.S. PATENT DOCUMENTS

| | | | |
|---|---|---|---|
| 4,447,717 | 5/1984 | Nohda | 250/201.4 |
| 4,562,344 | 12/1985 | Mihara et al. | 250/201.4 |
| 4,614,864 | 9/1986 | Wu | 250/201.4 |

*Primary Examiner*—David C. Nelms
*Assistant Examiner*—Que Tan Le
*Attorney, Agent, or Firm*—Ostrolenk, Faber, Gerb & Soffen

[57] ABSTRACT

A double-focus detector utilizing chromatic aberration vertically illumates a mask and a wafer which are disposed at a minute interval in the direction of illumination rays, in the direction normal to the mask and the wafer through a band-pass filter or band-pass filters which transmit a single wavelength ray and a wavelength-band ray, both or respectively and an objective to produce axial chromatic aberration corresponding to the minute interval with respect to the single wavelength ray and the wavelength-band ray, and observes images of the mask and the wafer which are formed by the single wavelength and the wavelength-band ray reflected by the mask and the wafer, thereby detecting a relative position between the mask and the wafer in a direction perpendicular to the optical axis of the illumination rays.

4 Claims, 10 Drawing Sheets

2μm 2μm

DOUBLE-FOCUS DETECTOR UTILIZING CHROMATIC ABERRATION

BACKGROUND OF THE INVENTION

The present invention relates to a position detector for use with a mask and a wafer of an X-ray exposure apparatus or the like which employs a double-focus optical system utilizing chromatic aberration.

I have proposed an alignment position detector having a double-focus system for simultaneously detecting mark patterns on a mask and a wafer, for example, which are disposed at a minute interval, by employing a double-focus optical system utilizing chromatic aberration in Japanese Patent Application Sho Nos. 62-196174 and Sho 63-30600.

The principle of the double-focus optical system utilizing chromatic aberration will be described hereinafter with reference to FIG. 13.

In general, an objective has chromatic aberration to light rays of different wavelengths. For example, it has two different focal lengths to two kinds of g ray (wavelength $\lambda = 435$ nm) and e ray ($\lambda = 546$ nm). Accordingly, two images of a mark on the same point formed by g and e rays are different in position.

By way of example, an objective of a numerical aperture N.A.=0.4 and a magnification n=10 has focal lengths Fe=12.5 mm and Fg=12.74 mm and image point distances $S'e = 137.615$ mm and $S'g = 137.5$ m, to e and g ray, respectively.

When objects such as a mask and a wafer are disposed at points M and M' which are at a minute interval $\delta$ in a direction of the optical axis of the objective, as shown in FIG. 13, a mark on the mask point M forms images at points C and D which are at distance $S'_2$ and $S'_3$ from the objective on the optical axis and a mark on the wafer point M' forms images at points B and C which are at distance $S'_1$ and $S'_2$ from the objective on the optical axis to g and e ray, respectively, since g (solid line) and e (broken line) ray have different respective focal lengths Fg and Fe. Thus, images of marks at the mask point M and at the wafer point M' are formed at the point C, because of chromatic aberration, while the image of a mark on the mask at the point C is formed by the g ray and the image of a mark on the wafer at the point C is formed by the e ray.

Making observation now by disposing a detector such as a television camera at the point C, both marks at the mask point M and the wafer point M' can be seen at the same time but they are attended with blurs because of chromatic aberration. These blurs caused by chromatic aberration can be removed by employing a pattern barrier filter, so called, which is formed by combining filters transmitting g ray and cutting e ray and vice versa. It makes possible to observe images of alignment marks on the mask and the wafer which marks are at different positions, at the same point C at the same time.

The pattern barrier filter will be described briefly with reference to FIGS. 14 to 16.

The pattern barrier filter A has two wavelength zones, as shown in FIG. 16, for example: the central zone of a filter I which transmits e ray and cuts the rest wavelength-zone rays and both side zones of filters II which transmit g ray and cut the rest wavelength-zone rays.

When images are formed with a chromatic aberration objective mentioned above by superposing a square mask mark a on a rectangular wafer mark b whose width is smaller than that of the mask mark a, for example, as shown in FIG. 14, a sharp image a' of the mask mark a which is in focus to g ray and a blurred image a" of the mask mark a which is out of focus to e ray are formed on an image forming surface right and left, as shown in FIG. 15. In addition, a sharp image b' of the wafer mark b to e ray and a blurred image b" of the wafer mark b to g ray are formed in the middle. Making observation by superposing a pattern barrier filter A on the image forming point, the blurred image a" of the mask mark and the blurred image b" of the wafer mark are cut respectively by the filters II and I. As a result, only the sharp mask mark a' and the sharp wafer mark b' are simultaneously seen on the whole and it makes possible to precisely align the mask and wafer which are different in position.

An objective for use in the present invention is a chromatic aberration objective which positively causes chromatic aberration and properly compensates various aberrations.

Based on the principle described above, positional detection of high resolution is made possible by assigning two foci to surfaces of a mask and wafer which are disposed at a minute interval by utilizing chromatic aberration. This method, however, necessitates a pattern barrier filter, so that the scope of image formation may be limited and thus the visual field is reduced. In addition, speckles due to interference occurring within the pattern barrier filter or between the pattern barrier filter and the image pickup surface of a detector have a bad influence.

To eliminate the disadvantages, I have proposed an apparatus of removing speckles caused within a pattern barrier filter or between a pattern barrier filter and the image pickup surface of a detector by utilizing a wavelength-band ray in Japanese Patent Application Sho No. 63-30600. However, an essential object employing a wavelength-band ray is to prevent a multiple interference. It is also possible to eliminate speckles by coating a reflection preventing film on a pattern barrier film.

The principle of this proposal will be briefly described hereinafter. To make connection with the illustration in FIG. 13, let light rays in use be three of g ray (436 nm), e ray (546 nm) and d ray (587 nm). In the case that an image of an alignment mark on a wafer is formed by applying d and e ray to the wafer surface, the characteristics P of chromatic aberration as shown in FIG. 17 will be obtained by using a chromatic aberration objective designed and manufactured based on the principle described hereinabove. Assuming that an axial chromatic aberration between g and e ray (focus shift) on the mask surface is 40 $\mu$m, this value corresponds to a gap $\delta$ between the mask and the wafer. It can be assumed that images formed by applying g ray to an alignment mark on the mask and e ray to an alignment mark on the wafer are at the same position.

Next, applying chromatic aberration compensation to d ray with an ordinary achromat to the chromatic aberration objective, so as to have an axial chromatic aberration Q shown in FIG. 18, the compensation of chromatic aberration to a wavelength-band ray in the neighborhood from e ray to d ray is made, so that an alignment mark on the wafer can be also detected at the same time with a required resolution. The condition $\phi$ for achromatization to e and d ray will be obtained as follows.

Let it be that the dispersion $v_1$ of a concave lens constituting an achromat is:

$$v_1 = (n_{1e} - n_{1d})/(n_{1g} - 1),$$

the focal length of the concave lens to g ray is $f_{1g}$, the dispersion $v_2$ of a convex lens constituting an achromat lens is:

$$v_2 = (n_{2d} - n_{2d})/(n_{2g} - 1),$$

and the focal length of the convex lens to g ray is $f_{2g}$. Then $$\frac{v_1}{f_{1g}} + \frac{v_2}{f_{2g}} = \phi$$

In addition, making consideration in the paraxial zone in a manner similar to FIG. 13, images formed by a wavelength-band ray including e and d ray are at the points C and D on the optical axis, as shown in FIG. 3.

In an apparatus employing the pattern barrier filter set forth hereinabove, when a light ray from a super-high pressure mercury-arc lamp of comparatively high coherency (half width: 5 nm) is applied to a pattern barrier filter of a random surface configuration, the light ray is scattered and the phase of the wave front of the light ray is mondulated at random, resulting in the formation of a random pattern having bright and dark areas in light intensity, that is, speckles. Since the speckle pattern is found everywhere in the structure of optical systems such as a diffraction surface and an image forming surface of rays, even in the double-focus apparatus utilizing a chromatic aberration objective set forth hereinabove, images of reduced resolution may be detected in a superposed manner on a television image receiveing surface. In other words, when light rays of comparatively increased coherency, for example, rays from superhigh pressure mercury-arc lamp or laser rays, are applied to a pattern barrier filter, the phase of the wave front of the rays is modulated at random by refraction, reflection and transmission of the optical system and the rays reach a television image receiving surface which is an observation surface. In the observation surface, speckles are caused.

The most important point in the above description is that speckles are caused due to light interference. This means that without light interference, no speckle occurs. Interferences which will be caused in a pattern barrier filter can be eliminated basically by coating a reflection preventing film.

Consequently, when an illumination ray of wavelength-band is employed, which is the one selected out of rays as from a halogen light source and a xenon light source by a band-pass filter and which is an aggregation of incoherent rays whose wave fronts are irregular in phase, frequency and amplitude and thus have extremely reduced interference, the light interference phenomenon set forth above does not occur. If any, a change in light intensity is too slight to catch it with an eye and a camera. Thus, speckles adversely affecting the resolution do not occur.

This is the principle of the proposal in Japanese Patent Application Sho No. 63-30600 which improves the resolution by eliminating speckles occurring in the pattern barrier filter or between the pattern barrier filter and the image pickup surface of the detecter with an illumination wavelength-band ray. However, an essential object employing a wavelength-band ray is to prevent multiple interference in a resist film on a wafer.

Even with the improved double-focus apparatus utilizing chromatic aberration, however, the problems of reduction in the region of image formation and the field of observation are still left.

To solve the problems, it is an object of the present invention to provide a double-focus apparatus utilizing chromatic aberration which is capable of detecting a relative position between a wafer and a mask which are disposed at a minute interval with a high accuracy without the use of a pattern barrier filter.

Furthermore, other objects of the present invention are specifically given as follows.

① A position detector is provided which does not use a pattern barrier filter which is comparatively difficult to manufacture and expensive.

② Circumferential parts of image formation can be simplified and miniaturized to reduce a cost since no pattern barrier filter is employed to make installation and adjustment unnecessary.

③ No restrictive condition that the area of image formation is limited by configuration of a pattern barrier filter which is defined by the configuration of a mark is provided to obtain a positional detector of an increased observation field. Namely, the condition to the area of image formation based on a pattern barrier filter is eliminated, resulting in that two areas of image formation on focal planes make the entire area of image formation, which is an observation field.

④ Since no pattern barrier filter is employed, no limitation in configuration of a detection pattern barrier filter is placed to make detection with any detection pattern possible.

⑤ There is no speckle due to interference caused in a pattern barrier filter or between a pattern barrier filter and an image pickup surface which receives an images of a detection camera, so that resolution of a detection system is improved.

⑥ Vignetting areas are inevitably caused at both ends of the central portion of a pattern barrier filter in manufacturing, so that resolution is liable to be reduced. In the present invention, however, since no pattern barrier filter is employed, there is no reduction of resolution due to vignetting, so that an optical resolution power is improved.

In the case that a double-focus apparatus utilizing chromatic aberration of the present invention is applied to an alignment apparatus of X-ray aligner for use in the field of a semiconductor lighography, the present invention has the following specific objects.

ⓐ No pattern barrier filter is mounted around a taking picture lens (relay lens) and a position detector is substantially composed of an objective, a lens barrel and a television camera, so that the detector can be miniaturized, simplified in structure and reduced in weight as a whole.

ⓑ No pattern barrier filter is employed and, as a result, speckles and vignetting will be removed, so that resolution is optically improved and an accuracy of alignment is greatly improved.

ⓒ Since no pattern barrier filter is employed, limitations regarding configuration of an alignment mark are completely eliminated, so that an alignment mark of any configuration can be set. In the past, however, because of difficulty of manufacturing a pattern barrier filter, a conventional alignment mark can be detected only with a mark for the detection of one axis. With the present invention, it is possible to detect a mark of two axes, for example, a crossed mark.

ⓓ The number of alignment apparatus can be reduced. By way of example, while the detection of three axes, X, Y and θ, has required to employ three detectors in the past, with the present invention it is possible to reduce detectors to two. Accordingly, in addition to the reduction of the number of alignment stages to be mounted on an alignment apparatus, it is possible to reduce a cost of the detector.

ⓔ The reduction of the number of alignment apparatus and alignment stages facilitates the dimensional design of the entire structure of the detector. In addition, the design condition of a mask stage is greatly lightened.

ⓕ No pattern barrier filter is employed and therefore there is no restriction of a catchup range (a visual field area of capable of detecting an alignment mark and making a positional measurement) which is given by a configuration of a pattern barrier filter. As a result, the scopes of fine alignment which is a fine position measurement and coarse alignment which is a coarse position measurement are greatly increased, so that misalignment (falling into a state of being unable to make alignment) (that is: an alignment mark gets out of place from a catchup range) is greatly reduced and throughput (the number of dealing with wafers per hour) is greatly improved.

ⓖ With a pattern barrier filter, a catchup range is largely reduced due to a configuration of the filter. (It depends upon magnification and, with my trial apparatus, is 15 μm on the surface of an object with a magnification of 150 with respect to alignment of an X ray mask.) (Even with reduction in magnification for coarse alignment to 30, the range is 75 μm, which is narrow.) As a result, it is difficult to share a detector in both alignments during a coarse alignment before a fine alignment, so that it is practically required for coarse alinment to further provide an optical system of a low magnification (5 to 30) and a low numerical aperture (N.A.=0.1). In contrast, since the present invention is not provided with a pattern barrier filter, the entire observation field becomes basically a catchup range. This fact is very convenient in coarse alignment of mask and wafer.

By way of example, when an apparatus for fine alignment is jointly used for coarse alignment, a catchup range is 15 μm×(150/30)=75 μm at the center of a pattern barrier filter with a magnification of 30 and this is insufficient for a catchup range in coarse alignment.

This means that a position of a wafer is shifted in the extent of 75 μm before coarse alignment with a mechanical method such as a positioning pin and it is difficult to obtain a precise positioning. According to a calculation in this example, since no pattern barrier filter is employed, a catchup range makes the whole area of observation and is magnified from 15 μm to 80 μm which is a length of a short side of 1" image pickup tube. Accordingly, an observation field at this case is 80 μm×(150/30)=400 μm, which is about five times as large as that when a pattern barrier filter is employed and in area $5^2=25$ times. This value may be sufficient for a range of the apparatus. Thus, the apparatus with no pattern barrier filter provided can be also shared in coarse alignment.

This makes it possible to conduct coarse alignment without the use of a detection apparatus which combines a microscope of a low numerical aperture for coarse alignment and an image receiving apparatus which are conventionally required. Thus, a double-focus apparatus utilizing chromatic aberration for fine alignment can be jointly used for coarse alinmnet. At this time, a required operation is only interchange of a taking picture lens. For example, a lens is interchanged by a revolver system to easily change a magnification of observation.

ⓗ This fact dispenses with the provision of a coarse alignment apparatus and an alignment mark is employed which makes a detection of two directions (X/Y) in the above ⓒ possible so that the number of required alignment apparatus can be reduced. By way of example, when three axes of X, Y and θ are detected by employing a conventional pattern barrier filter, it is required to provide total five units: three fine alignment apparatus of double-focus apparatus utilizing chromatic aberration and two coarse alignment apparatus which employ an objective of a low numerical aperture. In addition, it requires five alignment stages accordingly.

A double-focus apparatus utilizing chromatic aberration without a pattern barrier filter according to the present invention dispenses with a coarse alignment apparatus and can detect two axes of X-Y with a single alignment apparatus according to the above ⓒ. Thus, it is sufficient to provide only two alignment apparatus in total and this is a large improvement in operation. In addition, a dimensional design and the freedom of a mask stage which are severe in design are relieved. As a result, it is possible to make a design without any technical difficulties, resulting in reduction of a cost.

In addition, the rigidity of a mask stage including an alignment apparatus is increased to greatly affect the improvement of a final and overall accuracy in combination with an X-Y stage.

According to the present invention, a double-focus apparatus utilizing chromatic aberration for use in a positional detection apparatus for detecting a relative position between first and second object which are disposed at a minute interval, in a direction perpendicular to the interval direction, is characterized in that a vertical illuminator for simultaneously illuminating the first and second object in the direction of the interval by first single wavelength ray and second wavelength-band ray, including a band-pass filter or filters for transmitting said first and second ray, both or respectively and an objective for producing axial chromatic aberration corresponding to the minute interval with respect to the first single wavelength ray and the second wavelength-band ray, thereby simultaneously detecting a relative position between the first and second object in a direction perpendicular to the interval with rays reflected by the first and second object.

Consequently, it is possible to simultaneously detect a relative position between first and second objects which are disposed at a minute interval, in a direction perpendicular to the optical axis, without the use of a pattern barrier filter, resulting in that an alignment accuracy is improved because of the improvement in an optical resolution, a catchup range is increased and a positional detector apparatus can be simplified and miniaturized. In addition, the positional detector apparatus can detect a position without reducing resolution and a cost can be greatly reduced.

DESCRIPTION OF PREFERRED EMBODIMENTS

Figure 1:
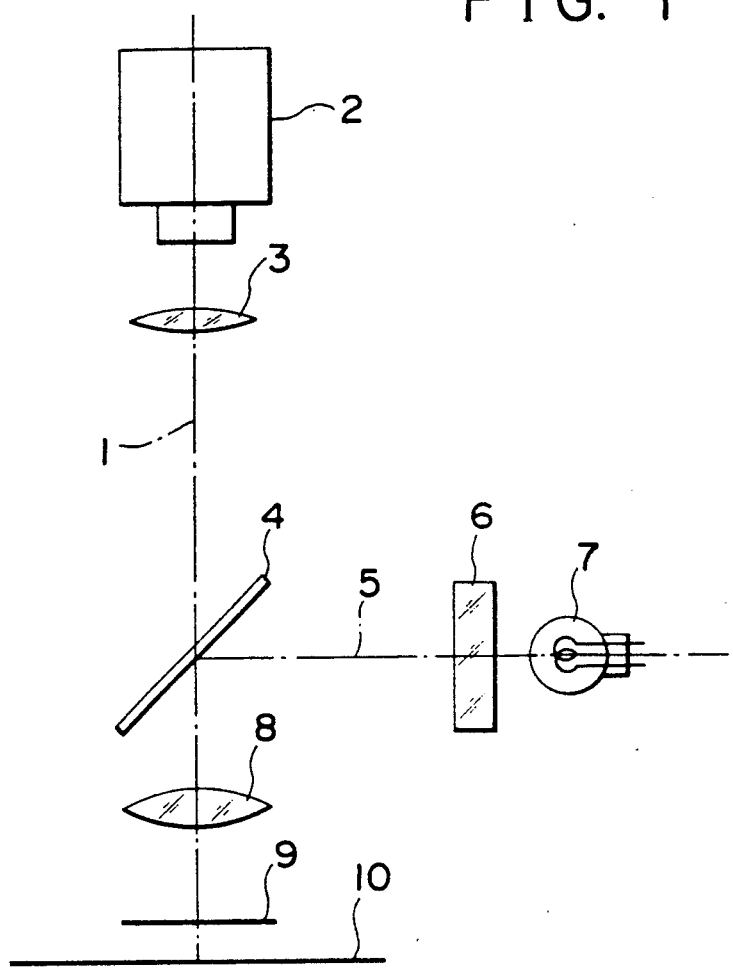
FIG. 1 is a diagram showing an optical structure of an embodiment of a double-focus detector utilizing chromatic aberration according to the present invention.

In FIG. 1 which shows an optical structure of a double-focus apparatus utilizing chromatic aberration according to the present invention, light rays from a light source 7 on the optical axis 5 of illumination light pass through a band-pass filter 6 and are reflected through 90° downward by a half mirror 4 which is arranged at an angle 45° to an detection optical axis 1. The reflected rays are converged by a chromatic aberration objective 8 to illuminate a mask 9 and a wafer 10.

Figure 2:
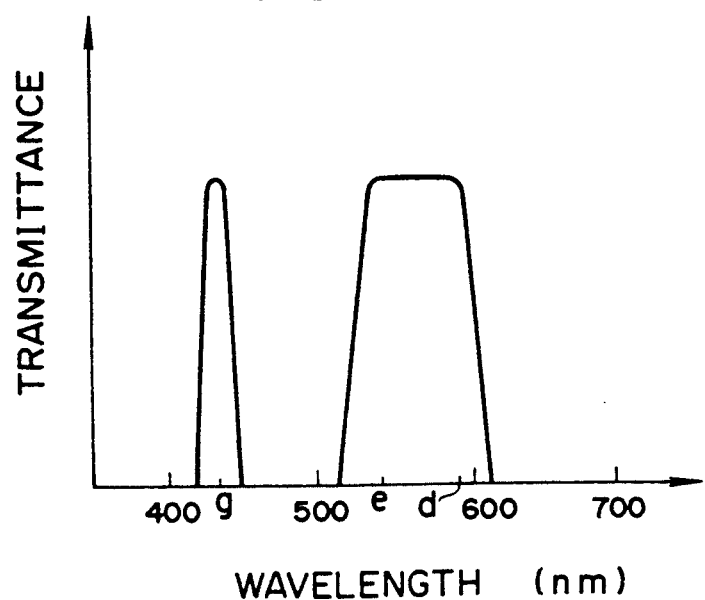
FIG. 2 is a diagram showing a spectral transmittance of a band-pass filter for use in FIG. 1.

The band-pass filter 6 has characteristics of a spectral transmittance shown in FIG. 2, which, for example, transmits g ray of wavelength $\lambda_1 = 436$ nm and a ray of a wavelength-band including e and d ray of wavelengths $\lambda_2 = 520$ nm to 600 nm.

Rays reflected by the mask 9 and the wafer 10 are again converged through the objective 8 and pass through the half mirror 4 to go straight along the optical axis 1 and then to form images of the mask 9 and the wafer 10. These images are picked up through a relay lens 3 by a camera 2.

Thus, the detector has a structure similar to that of an ordinary microscope having a vertical illuminator. Specifically, the difference is only that a band-pass filter 6 is set in place of an ND filter of the vertical illuminator apparatus of an ordinary microscope and thus the detector has apparently the same structure as that of a conventional microscope. In addition, the difference between the detector and a conventional double-focus apparatus is that no pattern barrier filter is disposed on the optical axis 1 and the band-pass filter 6 is employed in an illumination system of the detector of the present invention.

The chromatic aberration objective 8 is of a structure that chromatic aberration is positively caused and various aberrations are properly compensated, which is designed and manufactured in the aforesaid Japanese Patent Applications Sho Nos. 63-30600 and 62-196174, the latter being employed for illumination of a wavelength-band ray as an application of the former.

The principle of the double-focus apparatus utilizing chromatic aberration having a structure as shown in FIG. 1 will be described with reference to FIG. 3 which shows images formed in the paraxial area of the chromatic aberration objective 8. The mask 9 is disposed at a position M on the optical axis at a distnace S before the objective 8 and the wafer 10 is disposed at a position M' at a distance δ from the position M. The mask 9 and the wafer 10 are illuminated by both g ray and a wavelength-band ray including e and d ray which pass through the band-pass filter 6. Accordingly, an image of an alignment mark on the mask 9 by g ray is formed through the objective 8 at a point C at a distnace $S_2'$ from the objective 8 and an image of the mark on the mask 9 by the wavelength-band ray is formed through objective 8 at a point D at a distance $S_3'$ from the objective 8. In addition, an image of an alignment mark on the wafer 10 by the wavelength-band ray is formed at the point C at a distance $S_2'$ and an image of the mark on the wafer 10 by g ray is formed at a point B at a distance $S_1'$.

When a xenon lamp of high brightness, for example, is employed as an illumination light source 7, in the invention of the previous application, rays of below 530 nm and above 600 nm other than rays required for image formation of an alignment mark on the wafer 10 are cut by a pattern barrier filter and rays of below 430 nm and above 450 nm which are not required for image formation of an alignment mark on the mask 9 are cut at the same time. In the double-focus apparatus of the previous application, if being formed without a pattern barrier filter, images of the alignment marks on the mask 9 and the wafer 10 would be blurred due to chromatic aberration, which incurs reduction of resolution, since unnecessary rays are not cut by a pattern barrier filter. Thus, these images are in a blurred condition and it is impossible to obtain a desired resolution.

In the embodiment of the present invention, the band-pass filter 6 is arranged in the illumination device so that it transmits only two kind of rays for illumination of g ray and a wavelength-band ray including e and d ray.

Figure 4:
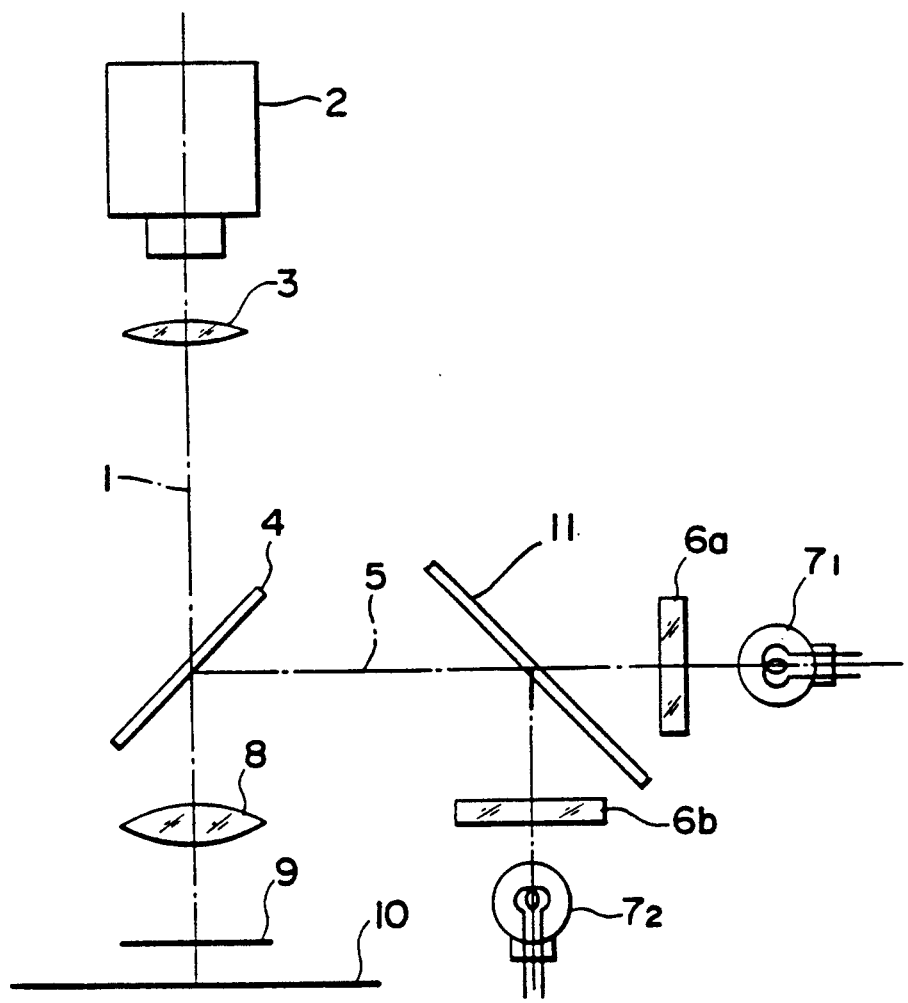
FIG. 4 is a diagram showing an optical structure of a modification of the present invention.

A modification of the present invention will be described with reference to FIG. 4. The aforesaid embodiment employs the single band-pass filter 6 which transmits two rays of g and wavelength-band of 520 nm to 600 nm including e and d ray, which has the characteristics of spectral transmittance shown in FIG. 2. It is considered, however, that such band-pass filter is comparatively difficult to manufacture and costly. For this reason, the modification is constructed such that a band-pass filter 6a which transmits g ray and another band-pass filter 6b which transmits a wavelength-band ray from 520 nm to 600 nm including e and d ray are respectively disposed before light source 7₁ and 7₂ to combine both the rays by a half mirror disposed on the illumination optical axis 5 at an angle of 45° thereto. Since other parts are similar to those in FIG. 1, like parts are given like reference characters and their description will be omitted.

The image formation by two rays thus selected is shown in Table 1.

TABLE 1

| Point of image | Kind of image | Wavelength of forming image |
|---|---|---|
| B | Mask | e to d |
| C | Wafer | e to d |
|   | Mask | g |
| D | Wafer | g |

Since two illumination rays required in the modification are a single ray and a wavelength-band ray, images are not formed at points other than those shown in Table 1. This fact is substantially different from a conventional detector apparatus which forms images at numberless points in addition to points of B, C and D.

The aforesaid feature makes it possible to give the following extremely convenient nature, taking a focal depth of the chromatic aberration objective 8 which is determined by its numerical aperture N.A. and two positions at a gap δ between a mask and a wafer into consideration.

Taking the case of an apparatus built as a trial by me, a numerical aperture of the chromatic aberration objective is N.A.=0.4, a focal depth is ±1.8 μm, a gap between two positions is δ=40 μm and magnification β is 150/133=Wafer/Mask.

Figure 3:
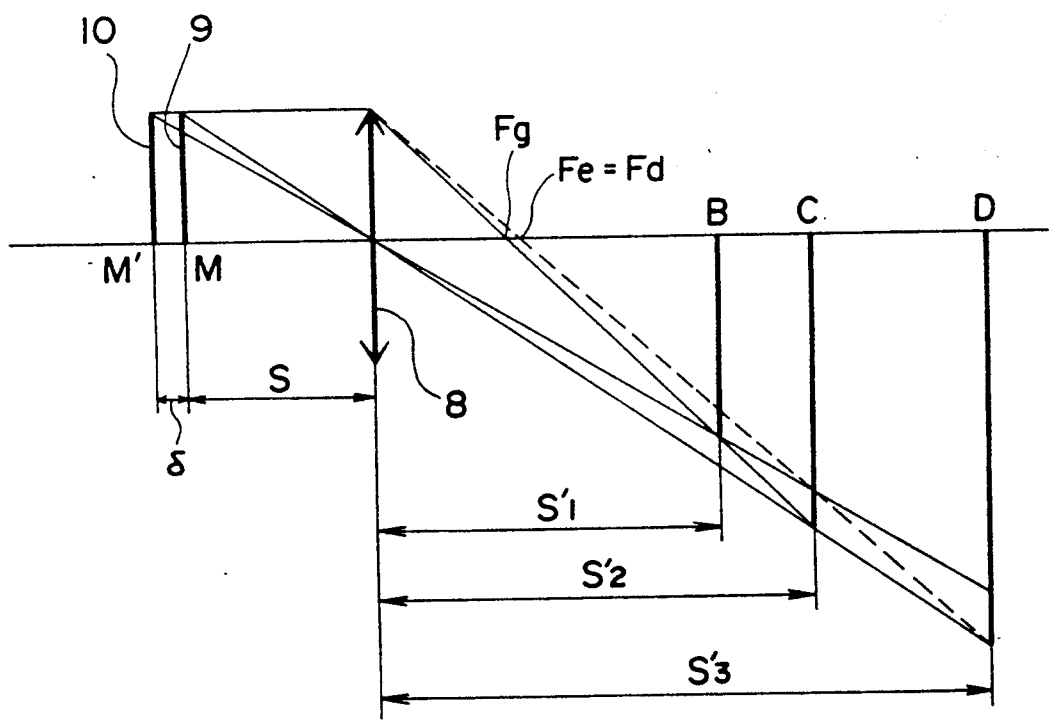
FIG. 3 is a diagram showing a paraxial zone for explaining the principle of a chromatic aberration objective.

In FIG. 3, image forming points are limited to three of B, C and D and there are any other points.

Describing this fact again, this is because illumination is limited to two rays. Considering the state of image formation at the point C, the image is vague due to blurring of chromatic aberration of the images formed at the points B and C.

At this point, the degree of vagueness of the image is important. If the degree of image vagueness does not affect resolution with respect to images of the marks on the mask and the wafer which are sharply formed at the point C, image vagueness caused at the image forming points B and D is not a matter of concern at all and it can be neglected. Accordingly, in order to evaluate the states of vagueness of the images formed at the points B and D with a spatial frequency MTF at the point C, the following experiment has been conducted.

An experimental apparatus: An ordinary microscope having a vertical illuminator system.
  Objective: N.A.=0.4
  Focal depth=±1.8 μm
  Magnification=150.

The objective in use has the same optical specifications as those of a chromatic aberration objective which I have manufactured for trial.

MTF observation pattern: Chromium alternately having lines and spaces each having a width of 2 μm is patterned in stripe on a slide glass of 50 μm thick.

Figure 5:
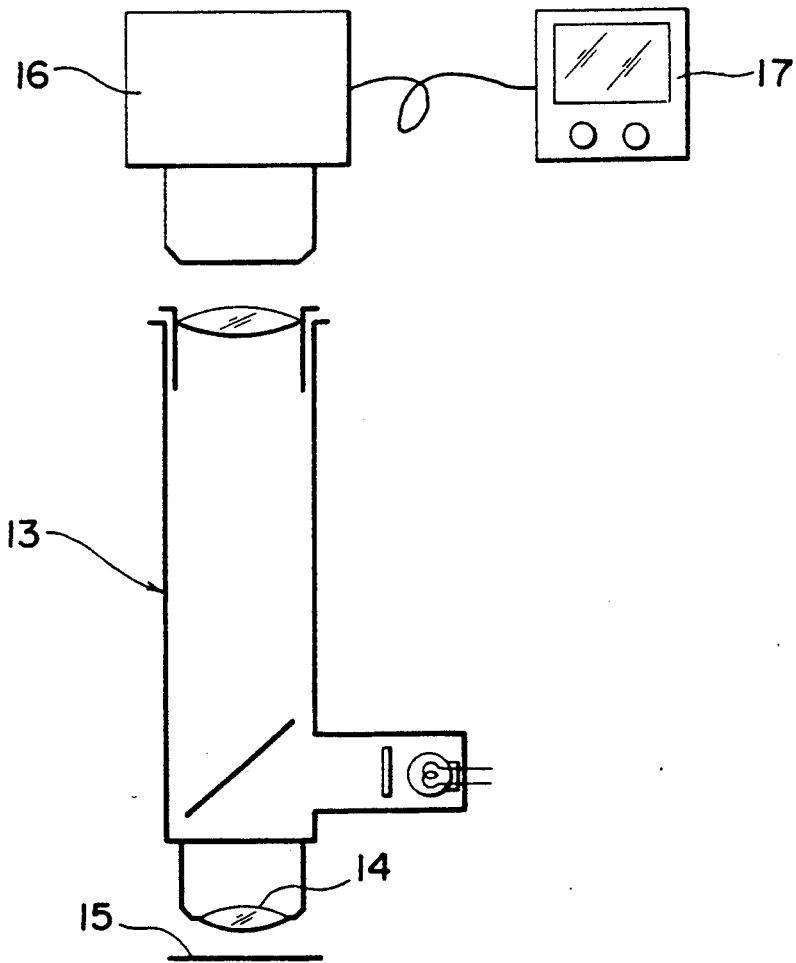
FIG. 5 is a side view showing an experimental apparatus for use in evaluation of the present invention.
Figure 6:
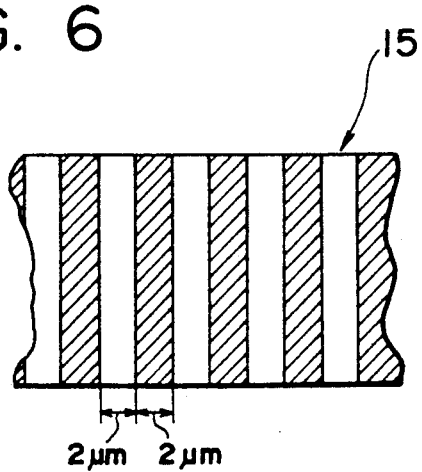
FIG. 6 is an enlarged diagram of an MTF observation pattern for use in the experimental apparatus shown in FIG. 5.

The structures of the experimental apparatus and on MTF observation pattern are shown in FIGS. 5 and 6, respectively.

Experimental method: The focus of an objective 14 of a microscope 13 is set to an MTF observation pattern 15, the resulted image is converted into an electric signal with an image pickup tube 16 to reproduce the image on a monitor 17 for observation, and the image thus reproduced is taken in a picture. Subsequently, the objective 14 is moved from the present position by 40 μm in its focal point so as to make a state out-of focus and an image out-of focus reproduced on the monitor 17 is taken in a picture.

Figure 7:
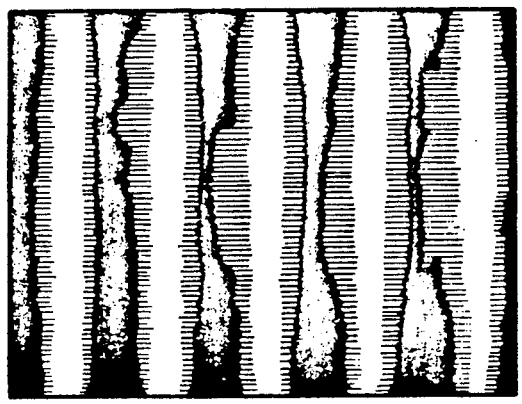
FIG. 7 is a diagram showing an image of the MTF observation pattern when the image is focused on the MTF observation pattern.
Figure 8:
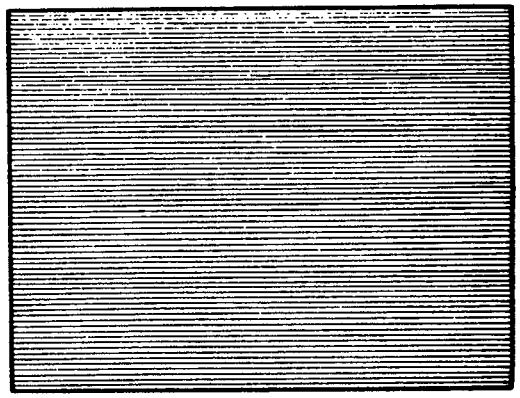
FIG. 8 is a diagram showing an image of the MTF observation pattern when an objective is moved by 40 μm from the state shown in FIG. 7.
Figure 9:
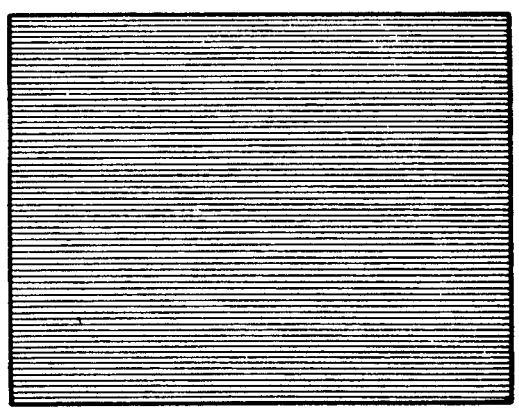
FIG. 9 is a diagram showing a brightness in the condition that there is no MTF observation pattern (bias)

Experimental results: FIG. 7 is a diagram when the objective 14 of the microscope 13 is focused on the MTF observation pattern 15. FIG. 8 is a diagram of a MTF observation pattern when the focus of the objective 14 is moved by 40 μm to make a state out-of focus. As is obvious from FIG. 8, it will be seen that the no image is formed in the state out-of focus of 40 μm. For reference, FIG. 9 is a diagram of a reproduced image on the monitor 17 when there is no sample.

Investigation: The image out-of focus shown in FIG. 8 is far from the category of resolution in an image out-of focus. This shows a state equivalent to a brightness of bias shown in FIG. 9 in which no image is formed.

Applying these experimental results to FIG. 3, consideration will be made as follows. Although the images formed at the points B and D on the optical axis are superposed on the image formed at the point C (contrast) on the optical axis as images out-of focus, it will be considered that the state of images formed at the positions B and D which are superposed at the point C is the same as that shown in FIG. 8 which is the experimental result.

In other words, when the image of the mask 9 formed at the point D on the optical axis reaches the point C on the optical axis, the image is not formed at the point C and has no effect upon resolution of an image formed at the point C.

Similarly, when the image of the wafer 10 formed at the point B on the optical axis reaches the point C, the image is not formed at the point C and has no effect upon resolution of an image formed at the point C.

These characteristics depend upon the focal depth of a chromatic aberration objective (that is, N.A.) and a gap between a mask and a wafer.

In the case of the above experiment, since a gap between a mask and a wafer is 40 μm which extremely large as compared with a focal depth of ±1.8 μm (N.A.=0.4), the very convenient characteristics mentioned above are obtained. When a gap between a mask and a wafer is constant, the larger a numerical aperture N.A. is, that is, the smaller a focal length is, the more the above characteristics are remarkable and the more the images formed at the points B and D do not affect resolution of an image formed at the point C.

On the other hand, if a numerical aperture is constant, that is, a focal depth is constant, the smaller a gap between a mask and a wafer is, the more the effects from the image formed at the points B and D can not be disregarded in the image formation at the point C.

Then, with respect to the relation between a numerical aperture N.A. (a focal depth) and a gap, I have studied whether the effects of the images at the points B and D are within a negligible scope, comparing the experimental results that I have conducted with a proper gap between a mask and a wafer in an X-ray aligner which is generally known.

According to my experiments, the resolution of detecting about 0.01 μm can be obtained with an objective of N.A.=0.3 and more. (Specifically, objectives of N.A.=0.3 and 0.4 are employed.)

In addition, a gap between a mask and a wafer is set to over 40 μm in most of X-ray aligners of synchrotron radiant ray (SOR) which have been keenly developed.

Making consideration now with the worst condition of a combination of N.A.=0.3 and a gap=40 μm, an objective of N.A.=0.3 has a focal depth of ±3.1 μm.

In contrast to this, since the gap of 40 μm is extremely large, it may be easily estimated that the effects of an image out-of focus can be equally disregarded even compared with the case of N.A.=0.4.

From the foregoing, in an X-ray aligner of SOR ray, it has been definitely shown that a double-focus detector utilizing chromatic aberration improved by the present invention can be used without the problem of reducing resolution due to an image out-of focus.

The above is the structure, the principle of the present invention and the experimental results related thereto.

Figure 10:
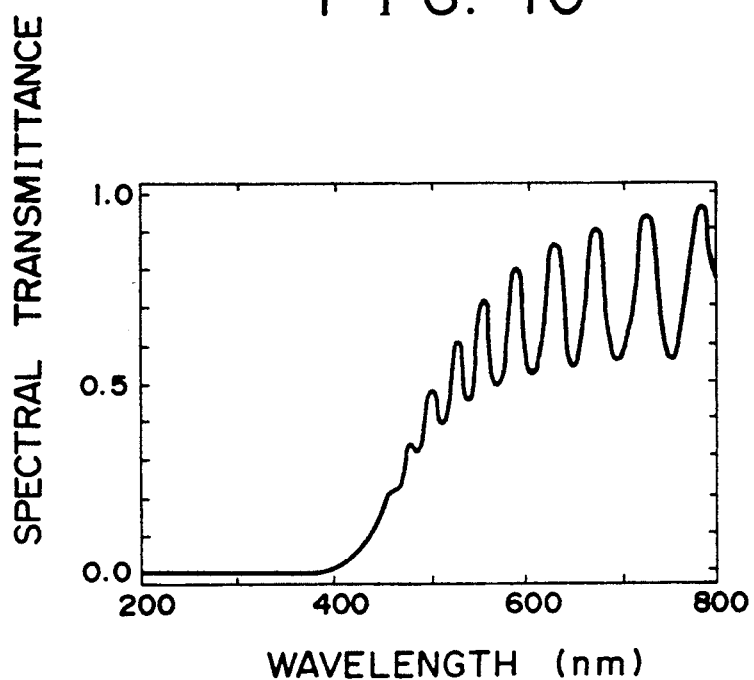
FIG. 10 is a diagram showing a spectral transmittance of a SiN membrane.

In the above embodiment, two rays of g ray and a wavelength-band ray including e and d ray are employed. This is because the description is made assuming that a superhigh pressure mercury-arc lamp is employed. From the following reasons, it is preferred that rays longer than about 500 nm in wavelength are employed for both a mask and a wafer without the use of a ray of short wavelength such as g ray, because a transmittance of a membrane SiN is low at a wavelength below 500 nm. FIG. 10 is a diagram of the spectral transmittance of an X-ray mask (thickness of SiN membrane: 2 μm) to wavelengths (The proceedings of Precision Engineering Society, Vol. 53, No. 11, 1987).

Figure 11:
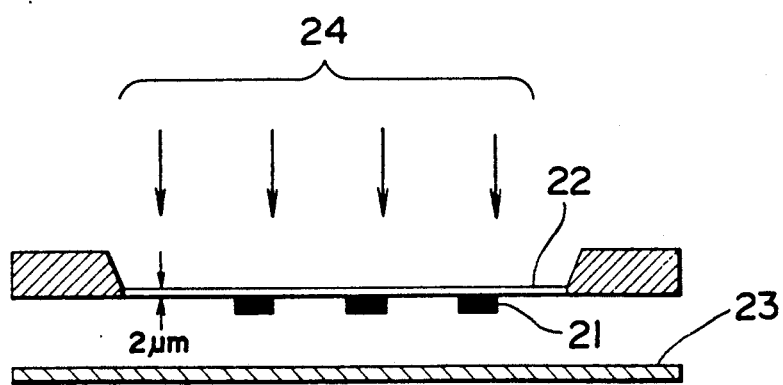
FIG. 11 is a enlarged side section view of a mask and a wafer.

FIG. 11 is a side view when a mask 22 is opposite to a wafer 23. A pattern 21 of tantalum Ta of an X-ray absorber is formed on the lower side of a membrane SiN 22 of 2 μm thick and the wafer 23 is disposed under the tantalum pattern 21 at a distance. Since the tantalum pattern 21 which forms a detection pattern is under an alignment ray 24 through the membrane SiN 22, when the alignment ray of wavelength of below 500 nm is applied, an alignment mark on the mask 22 is also detected through the membrane SiN 21. As a result, over 50% of the alignment rays are absorbed by the membrane SiN 21 to cause reduction of accuracy of detection due to insufficient brightness. For example, when the alignment ray 24 is g ray, its transmittance is about 20% and this is improper in brightness for an alignment ray. Accordingly, as a light source in the detector apparatus described above, a xenon lamp of high brightness is proper for use. It may be considered to be proper that a ray of about 510 nm (half-width of 30 nm) is applied to a mask surface and a ray of wavelength-band of 570 nm to 680 nm is applied to a wafer surface.

An example of alignment apparatus applying the double-focus apparatus utilizing chromatic aberration of the present invention to an alignment apparatus of an X-ray aligner including an X-ray source of synchrotron radiant ray (SOR) will be described hereinafter.

Figure 12:
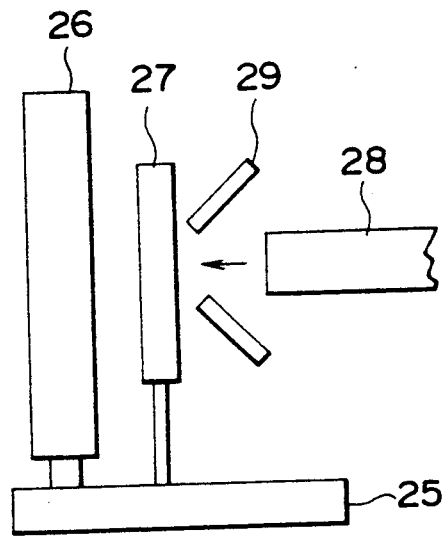
FIG. 12 is a side view showing the arrangement of an alignment apparatus.
Figure 13:
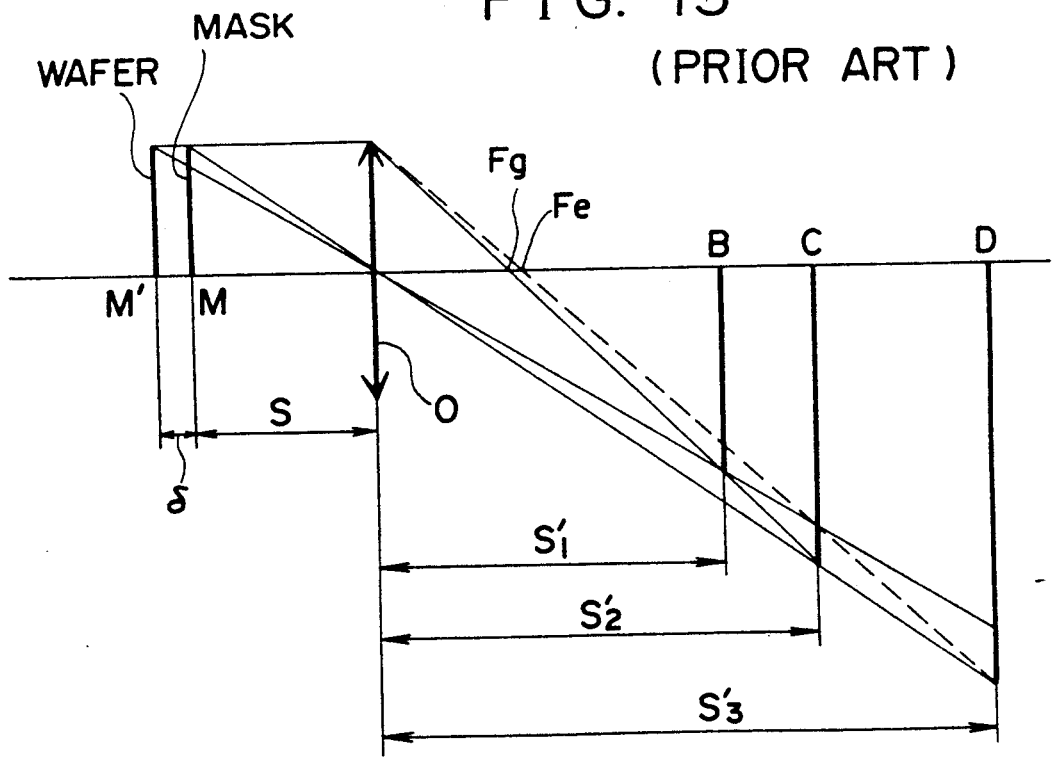
FIG. 13 is an optical path diagram in a paraxial zone for explaining the principle of a conventional chromatic aberration objective.
Figure 14:
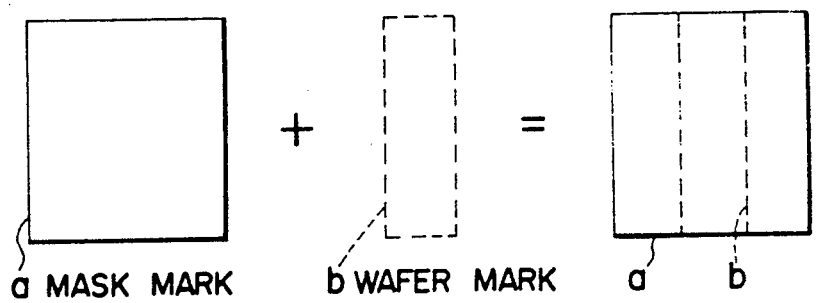
FIGS. 14 to 16 are diagrams for explaining the state of observing a mask mark and a wafer mark by employing a conventional pattern barrier filter and a chromatic aberration objective.
Figure 15:
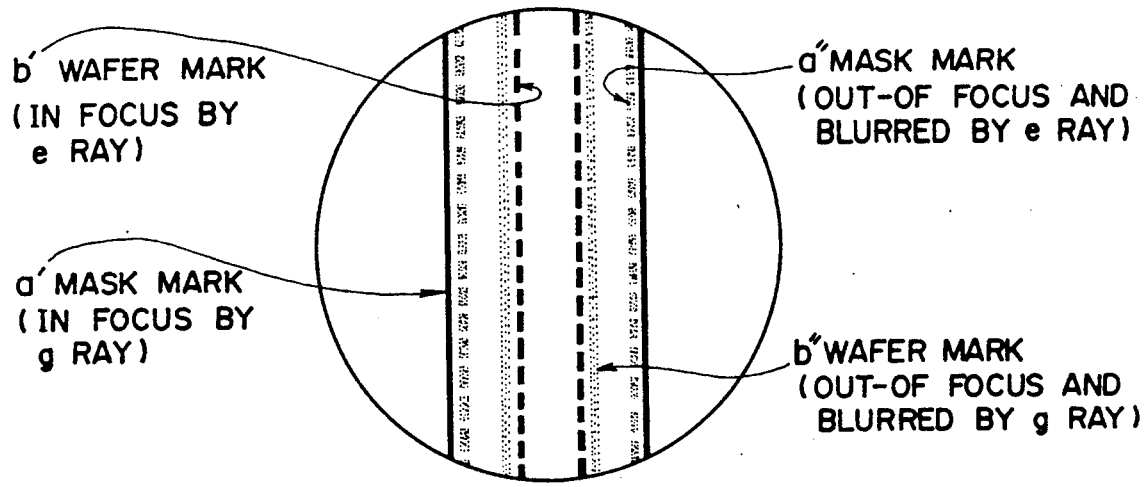

In FIG. 12, which is a schematic diagram of a structure of the example of alignment apparatus, a vertical X-Y stage 26 and a mask stage 27 are disposed in parallel on a base 25 having an anti-vibration device and an X-ray emission window 28 is horizontally arranged in opposing relationship with the mask stage 27. Two alignment apparatus for determining a relative position by detecting alignment marks on a wafer on the X-Y stage 26 and a mask on the mask stage 27 which are provided in scribing lines in the outer periphery of an X-ray exposure area are obliquely arranged to the wafer and the mask. The total of two alignment apparatus 29 are provided each of which is used for both coarse and fine alignment (the double-focus apparatus according to the present invention).

In operation, coarse alignment is first conducted between the mask and the wafer and a relative position therebetween in determined to about ±0.5 μm. Subsequently, fine alignment is conducted by raising a detection magnification by changing a magnification of a taking lens in the alignment apparatus 29 to determine a relative position between the mask and the wafer to about ±0.01 μm.

A relative position is detected by the alignment apparatus 29 and its signal is fed back to the X-Y stage 26 and the mask stage 27 to control them. The alignment signal has a response nature sufficient to determine a position of the X-Y stage 26. This largely affects the improvement of overall alignment accuracy.

Problems (actions, effects) solved by the present invention will be further described in connection with the order listed in the aforesaid objects of the present invention in the following.

Figure 16:
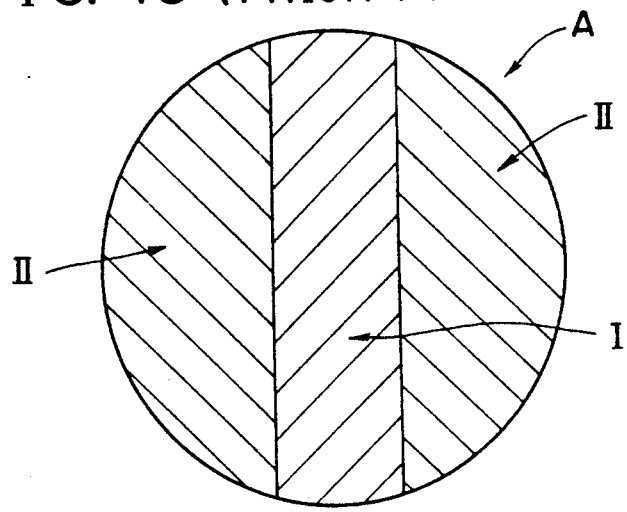
Figure 17:
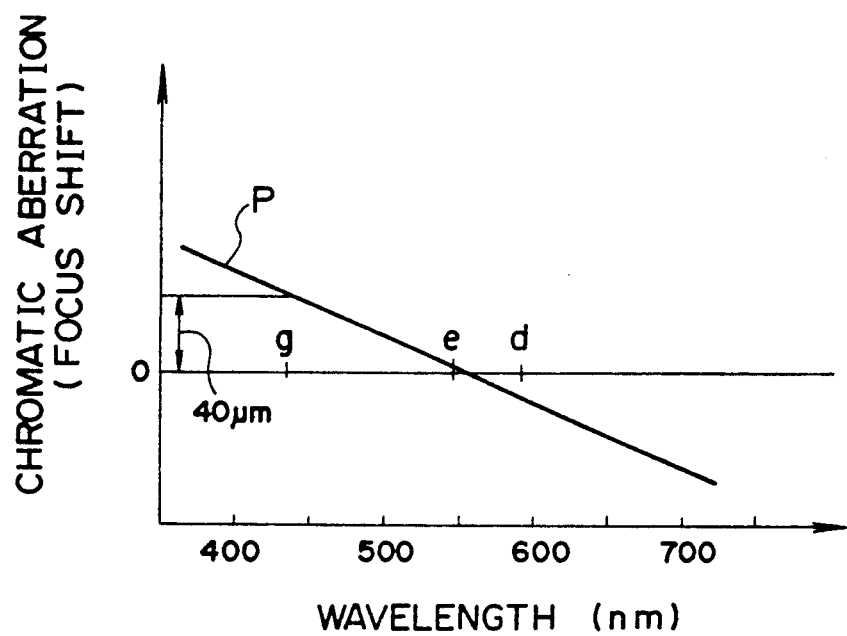
FIGS. 17 and 18 are diagrams for explaining the principle of a chromatic aberration objective.
Figure 18:
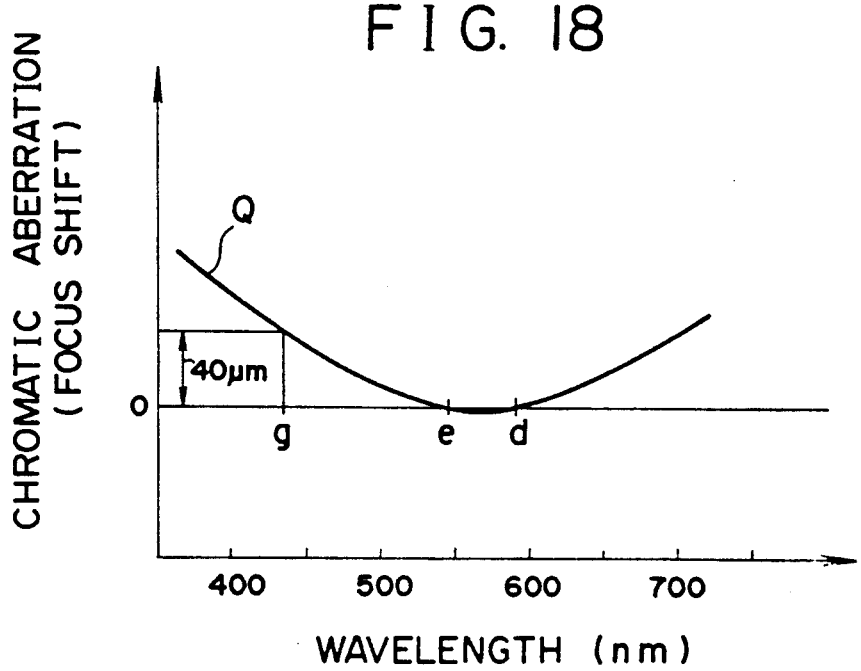

① A pattern barrier filter A is formed, as shown in FIG. 16, by combining two kinds of band-pass filters I and II by adhesion. Accordingly, its manufacturing is complicated in process and expensive as compared with an ordinary filter. Since the present invention dispenses with a pattern barrier filter, it reduces a cost.

② A centering operation to the optical axis of a camera is required for a pattern barrier filter. In addition, a precise adjustment mechanism for three axis of X, Y and θ has to be provided. In contrast to this, the present invention, in which no pattern barrier filter is employed, can largely reduce a cost and requires no troublesome adjustment mechanism.

③ When a pattern barrier filter is employed, the scope of forming images of a mask pattern and a wafer pattern is limited by configuration of the pattern barrier filter. By way of example, if a detection scope is a 60 μm wide and 90 μm long and it is divided into three scopes by a pattern barrier filter, the divided detection scope is a 60 μm wide and 30 μm long and the center scope is especially reduced to one-third of the area of a 60 μm wide and 30 μm long. In the present invention, however, there is no reduction of a detection scope.

Figure 19:
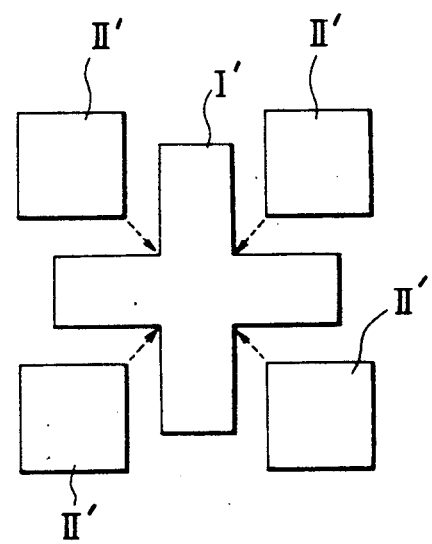
FIG. 19 is a diagram showing a structure of a pattern barrier filter for two axes.

④ Since a pattern barrier filter is formed by combining two band-pass filters of different transmittance characteristic by adhesion, as shown in FIG. 16, difficulties in manufacturing are increased and design conditions are limited as compared with an ordinary filter. By way of example, when two axes of X-Y are detected with a single alignment apparatus, a cross-shaped mark is required. When a pattern barrier filter in connection with the cross-shaped mark is manufactured, it is necessary to manufacture the filter by combining a cross-shaped band-pass filter I' and a square band-pass filter II' by adhesion, for example, as shown in FIG. 19, which makes it more difficult in manufacturing.

On the contrary, the present invention, in which no pattern barrier filter is employed, has no such restriction and can use any configuration of alignment marks. In addition, it is possible to use a mark which is capable of simultaneously detecting two axes of X-Y by a single alignment mark.

⑤ Since pattern barrier filter is opposite to the image pickup surface of a detector, a speckle pattern is produced between them to reduce resolution. (However, this is can be prevented by coating a reflection preventing film on a pattern barrier film.) In the present invention, however, no pattern barrier filter is used and therefore no speckle pattern is produced, resulting in no reduction in a resolution power.

⑥ It is common that indian ink is applied to the adhesion boundary of a pattern barrier filter and the boundary has a burr removed surface. As a result, vignetting is inevitably caused and it largely affects particularly upon parts held between the pattern barrier filter parts at the center to be liable to reduce resolution.

In the present invention, however, no pattern barrier filter is employed and therefore there is no vignetting.

In the case that a synchrotron radiation (SOR) source is applied to an X-ray aligner, problems (actions and effects) solved in connection with numbers described in the foregoing objects will be described in the following.

ⓐ No adjustment mechanism of a pattern barrier filter is required, resulting in miniaturization of the entire alignment apparatus in size. By the way, in the alignment apparatus designed in the present invention, the outer dimensions of the body except an objective are 80 mm long, 80 mm wide and 20 mm thick and a lens barrel is 20 mm long, thus being very compact. In this regard, the present invention which dispenses with an adjustment mechanism for a pattern barrier filter is very important. That is, taking interference with a mask stage into consideration, the above effect is of deep significance.

ⓑ Since reduction in optical resolution is obviated from the foregoing 5 and 6, an accuracy of alignment signals which are controlled by making feedback to an X-Y stage and a mask stage is remarkably improved.

ⓒ The aforesaid 3 and 4 are similarly applicable and the description will be omitted.

ⓓ It is possible to set a cross-shaped mark from the aforesaid 3 and 4, resulting in that two axes of X-Y can be detected with a single alignment apparatus. Since a relative position between a mask and a wafer is generally defined by three axes of X, Y and $\theta$, it is required to provide at least three alignment apparatus. By the present invention, which makes possible to detect two axes, the detection of $(X_1, Y_1)$ and $(X_2, Y_2)$ can be made with two respective alignment apparatus, so that $\theta$ can be detected from these. As a result, a cost is reduced to two-thirds and miniaturization can be made.

ⓔ It is similar to g and h which will be described later and its description will be omitted.

ⓕ Since no pattern barrier filter is employed, the fact that a catchup range is largely increased is of great significance, particularly during coarse alignment.

In a light stepper apparatus including an X-ray aligner which is presently used, positionings of a mask and a wafer are conducted by the following three steps.

(1) When a wafer is mounted on a chuck, an accuracy of mechanical positioning with a positioning pin is about 300 $\mu$m to 100 $\mu$m.

(2) Subsequently, coarse alignment with an alignment apparatus is conducted. An accuracy of this operation is generally about 1 $\mu$m.

(3) Finally, fine alignment of the mask and the wafer with the alignment apparatus is conducted.

The aforesaid steps ① to ③ are conducted fully automatically and are the main point in improvement of throughput.

A catchup range during coarse alignment described in the above (2) is particularly the point while a fully automatic adjustment is conducted smoothly. If the catchup is not made at this point, it is necessary to rely upon a manual operation after the step operation is interrupted, thus resulting in large reduction of throughput.

This is because an accuracy of mechanical positioning described the above (1) is unstable as compared with those in the aforesaid (2) and (3).

Then, it is preferred that a catchup range of the aforesaid (2) is obtained as large as possible. In particular, since an X-ray aligner employing an SOR source has a vertical structure, its accuracy has an inclination to be reduced as compared with that such as a horizontally placed light stepper.

By way of example, let it be assumed that a conventional double-focus detector utilizing chromatic aberration is employed. Assuming that a magnification of the detector is about 30, its detection field is 400 $\mu$m $\times$ 300 $\mu$m. When this field is simply divided into three fields with a pattern barrier filter, the detection field is reduced to 130 $\mu$m $\times$ 300 $\mu$m and a catchup range is also reduced accordingly. There is a high possibility of being unable to catch up and operations from the steps (1) to (2) would be interrupted. To prevent this, when a magnification of detection is reduced, the accuracy of detection is disadvantageously reduced accordingly.

Figure 20:
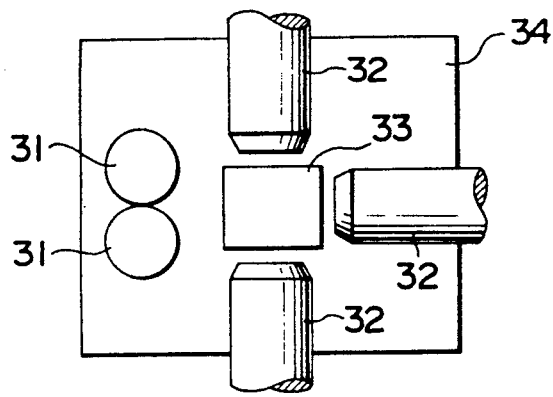
FIG. 20 is a diagram showing an arrangement of a conventional detector for use in an X-ray aligner.

From the foregoing, as long as a pattern barrier filter is employed, a catchup range, magnification and accuracy of detection in the aforesaid (2) have problems of interfering with one another. In addition, affecting the accuracy in the aforesaid (1), design and manufacturing therein become troublesome. According to the present invention, since no pattern barrier filter is required, the problems listed above are cleared off.

ⓖ By increasing a catchup range according to the above f, it is possible to use an alignment apparatus for both fine and coarse alignment.

ⓗ FIG. 20 is a diagram of arrangement when a conventional double-focus apparatus utilizing chromatic aberration is mounted on an X-ray aligner. Three alignment apparatus 32 for fine alignment are obliquely arranged around an X-ray transmission region 33 of 25 mm $\times$ 25 mm at the center of a mask stage 34. Two coarse alignment apparatus 31 are arranged on the left side. Thus, five alignment apparatus are arranged in total.

Figure 21:
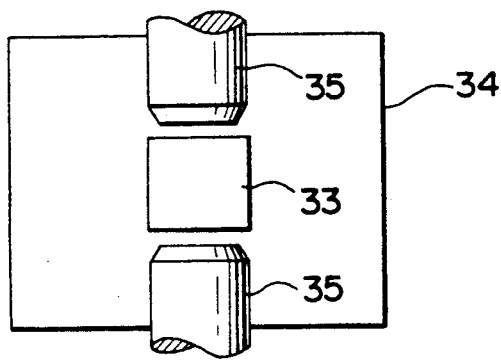
FIG. 21 is a diagram showing an arrangement of a detector for use in an X-ray aligner according to the present invention.

In contrast to this, in the present invention, only two alignment apparatus 35 as shown in FIG. 21 for use in both fine and coarse alignment are obliquely arranged around an X-ray transmission region 33 at the center of a mask stage 34.

Comparing FIG. 20 with FIG. 21, it is obvious that an alignment apparatus of the present invention is made simple. In addition, the problems of dimensional interference with a mask stage is cleared away and the freedom in more practical design of a mask stage is increased. Furthermore, though not shown in FIGS. 20 and 21, since the number of alignment apparatus is reduced from 5 to 2, the entire apparatus including a processing apparatus is miniaturized and simplified, resulting in reduction of a cost.

While the foregoing describes an embodiment of positional detectors between two objects such as mainly a wafer and a mask, it is possible to apply it to further more fields in a manner similar to observation with an ordinary microscope, since no pattern barrier filter is required and an observation field is largely increased. By way of example, while, with an optical microscope, the detection of a film thickness or simultaneous observation of two objects which are disposed at different positions on the optical axis are practically impossible because of a short focal length, the present invention makes it possible to achieve such operations, thus increasing application fields largely.

What is claimed is:

1. A double-focus detector utilizing chromatic aberration for use in a position detector apparatus for detecting a relative position between first and second object which are disposed at a minute interval, in a direction perpendicular to the interval direction, comprising:

vertical illuminator means for simultaneously illuminating said first and second object in the direction normal thereto, by first single wavelength ray and second wavelength-band ray, including a bandpass filter or filters for transmitting said first and second ray, both or respectively;

objective means for producing axial chromatic aberration corresponding to said minute interval with respect to said first and second ray; and image pickup means for picking up images of said first and second object which are formed by said first and second ray reflected by said first and second object.

2. A double-focus detector according to claim 1, in which said first wavelength ray is a ray of wavelength about 510 nm.

3. A double-focus detector according to claim 1, in which said second wavelength-band ray is a ray of wavelengths about 570 to about 680.

4. A double-focus detector according to claim 1, in which said first and second object are a mask and a wafer, respectively.

* * * * *